United States Patent
Özyilmaz et al.

(10) Patent No.: US 10,228,784 B2
(45) Date of Patent: Mar. 12, 2019

(54) HUMAN-MACHINE INTERFACE WITH GRAPHENE-PYROELECTRIC MATERIALS

(71) Applicant: National University of Singapore, Singapore (SG)

(72) Inventors: Barbaros Özyilmaz, Singapore (SG); Eeshan Sandeep Kulkarni, Singapore (SG); Sascha Pierre Heussler, Singapore (SG); Antonio Helio Castro Neto, Singapore (SG); Henrik Andersen, Singapore (SG)

(73) Assignee: National University of Singapore, Singapore (SG)

( * ) Notice: Subject to any disclaimer, the term of this patent is extended or adjusted under 35 U.S.C. 154(b) by 62 days.

(21) Appl. No.: 15/323,243

(22) PCT Filed: Jul. 7, 2015

(86) PCT No.: PCT/SG2015/050201
§ 371 (c)(1),
(2) Date: Dec. 30, 2016

(87) PCT Pub. No.: WO2016/007089
PCT Pub. Date: Jan. 14, 2016

(65) Prior Publication Data
US 2017/0139495 A1 May 18, 2017

Related U.S. Application Data

(60) Provisional application No. 62/021,770, filed on Jul. 8, 2014.

(51) Int. Cl.
*G06F 3/041* (2006.01)
*G06F 3/01* (2006.01)
(Continued)

(52) U.S. Cl.
CPC ............ *G06F 3/041* (2013.01); *G01J 5/0025* (2013.01); *G01J 5/046* (2013.01); *G01J 5/20* (2013.01);
(Continued)

(58) Field of Classification Search
CPC .. G06F 3/041; G06F 2203/04102; G01J 5/20; G01J 5/34
See application file for complete search history.

(56) References Cited

U.S. PATENT DOCUMENTS

| 3,772,518 A | 11/1973 | Murayama et al. |
| 4,682,030 A * | 7/1987 | Rose ..................... G01J 5/04 |
| | | 250/338.3 |

(Continued)

FOREIGN PATENT DOCUMENTS

| EP | 2614343 A1 | 7/2013 |
| WO | 2014037016 A1 | 3/2014 |
| WO | WO 2015/084267 A1 | 6/2015 |

OTHER PUBLICATIONS

"Answers to Questions on MCT's Advantages as an Infrared Imaging Material", DRS Technologies (Apr. 8, 2010).
(Continued)

*Primary Examiner* — Christopher E Leiby
(74) *Attorney, Agent, or Firm* — Hamilton, Brook, Smith & Reynolds, P.C.

(57) ABSTRACT

A version of the invention comprises a device for controlling or interfacing with a computer or other form of communicable machine based on the pyroelectric effect, and includes at least one optically- and infrared- (IR-) transparent graphene electrode.

20 Claims, 3 Drawing Sheets

(51) Int. Cl.

| | |
|---|---|
| *G06F 3/03* | (2006.01) |
| *G01J 5/20* | (2006.01) |
| *G01J 5/34* | (2006.01) |
| *G01J 5/04* | (2006.01) |
| *H01L 37/02* | (2006.01) |
| *G01J 5/00* | (2006.01) |

(52) U.S. Cl.
CPC .................. *G01J 5/34* (2013.01); *G06F 3/01* (2013.01); *G06F 3/03* (2013.01); *G06F 3/0412* (2013.01); *H01L 37/02* (2013.01); *H01L 37/025* (2013.01); *G01J 2005/345* (2013.01); *G06F 2203/04102* (2013.01); *G06F 2203/04108* (2013.01)

(56) References Cited

U.S. PATENT DOCUMENTS

| | | | |
|---|---|---|---|
| 4,792,682 A | 12/1988 | Endou et al. | |
| 5,108,576 A | 4/1992 | Malmros et al. | |
| 5,695,091 A | 12/1997 | Winings et al. | |
| 6,495,828 B1 | 12/2002 | Tidrow et al. | |
| 8,110,883 B2* | 2/2012 | Ward | G01J 5/02 257/428 |
| 9,797,779 B2 | 10/2017 | Ozyilmaz et al. | |
| 2009/0072143 A1 | 3/2009 | Ishida et al. | |
| 2011/0050643 A1 | 3/2011 | Zhao et al. | |
| 2012/0080086 A1 | 4/2012 | Yoon et al. | |
| 2013/0118550 A1* | 5/2013 | Sahin | H01L 31/042 136/246 |
| 2014/0063368 A1 | 3/2014 | Yamazaki et al. | |
| 2014/0160434 A1* | 6/2014 | Brown, Jr. | A61B 3/113 351/210 |
| 2014/0200496 A1* | 7/2014 | Hyde | A61F 5/02 602/19 |
| 2015/0369668 A1* | 12/2015 | Watabe | H01L 37/02 250/338.3 |
| 2016/0161340 A1 | 6/2016 | Colli | |
| 2016/0305824 A1* | 10/2016 | Ozyilmaz | G01J 5/34 |
| 2016/0324677 A1* | 11/2016 | Hyde | A61F 5/34 |
| 2017/0316487 A1* | 11/2017 | Mazed | G06F 19/70 |

OTHER PUBLICATIONS

"Technology Overview Microbolometer Detectors: Microbolometer focal plane arrays", http://www.electrophysics.com/View/Viw_TechPrimer_UncooledTutorial.asp, (Oct. 1, 2014).

Bae, S., et al., "Roll-to-roll production of 30-inch graphene films for transparent electrodes", *Nat Nano*, 2010. 5(8): p. 574-578.

Bae, S.H., et al., "Graphene-P(VDF-TrFE) multilayer film for flexible applications", *ACS Nano*, 2013, 7(4): 3130-3038.

Balcerak, R., et al., "Mercury cadmium telluride material requirements for infrared systems", *J. Vac. Sci. Technol. B*. 10, 1353-1358 (1992); doi: 10.1116/1.585868.

Barone, P.W., et al., "Near-infrared optical sensors based on single-walled carbon nanotubes", *Nat Mater*, 2005. 4(1): p. 86-92.

Bravina, S.L., et al., "Thermal Characterization of Absorbing Coatings for Thermal Detectors of Radiation by Photopyroelectric Method", eprint arXiv:cond-mat/0603529, 2006, 9 pgs. 3529.

de Goeij B., et al. "Microbolometer Spectrometer MIBS: Smaller and smarter", 5th ESA Round Table on Micro/Nano Technologies for Space, Oct. 3-5, 2005, 7 pgs.

Deming, D., et al., "Infrared radiation from an extrasolar planet", *Nature*, 2005. 434(7034): p. 740-743.

Dong Hoon, C., et al., "Pyroelectric Properties of the B-Polyvilnylidene Flouride (PVDF) Thin Film Prepared by Vacuum Deposition with Electric Field Application", *Japanese Journal of Applied Physics*, (Nov. 2002) 41, Part 1, No. 11B, pp. 7234-7238.

Emmerich, R., et al., "Pyroelectric effects in PVDF and P(VDF-TrFE)", in Electrets, (ISE 7) Proceedings., 7th International Symposium on (Cat. No. 91CH3029-6). p. 466-471, 1991.

Fujitsuka, N., et al., "Monolithic pyroelectric infrared image sensor using PVDF thin film. in Solid State Sensors and Actuators", 1997. Transducers '97, Chicago., International Conference, pp. 1237-1240 (Jun. 16-19, 1997).

Granqvist, C.G., et al., "Transparent and conducting ITO films: new developments and applications", *Thin Solid Films*, 2002. 411(1): p. 1-5.

Han, Q., et al., "Highly sensitive hot electron bolometer based on disordered graphene", *Sci. Rep.*, 3: 3533, pp. 1-6, 2013.

Hsiao, C.-C., et al., "Electrode layout of ZnO pyroelectric sensors", *Journal of Mechanical Science and Technology*, 2011. 25(11): p. 2835-2842.

Hu, L., et al., "Infrared transparent carbon nanotube thin films", *Applied Physics Letters*, 2009, 94(8): p. 081103-01-081103-3.

Hur, S-G, et al. "NiCr Alloy as both Absorption layer and top electrode onto Pb(Zr0.3Ti0.7)O3 thin films for Infrared Sensors", *Integrated Ferroelectrics: An International Journal*, 54:1, 741-746, 2003. DOI: 10.1080/714040724.

International Search Report and Written Opinion for Int'l Application No. PCT/SG2014/000579, titled: Pyroelectric Detector Using Graphene Electrode, dated Mar. 17, 2015.

International Search Report and Written Opinion for Int'l Application No. PCT/SG2015/050201, titled: Human-Machine Interface With Graphene-Pyroelectric Materials, dated Aug. 20, 2015.

Jo, G., et al., The application of graphene as electrodes in electrodes and optical devices, *Nanotechnology*, 2012, 23: 112001, 20 pgs.

Kallhammer, J.-E., "Imaging: The road ahead for car night-vision", *Nat Photon*, 2006. sample(sample): p. 12-13.

Kulkarni, E.S., et al., "Exploiting the IR-Transparency of Graphene for Fast Pyroelectric Infrared Detection", *Advanced Optical Materials*, 2015, 3: 34-38.

Kwon, S.Y., "Effect of P(VDF/TrFE) Film Thickness on the Characteristics of Pyroelectric Passive Infrared Ray Sensor for Human Body Detection", *Journal of Sensor Science and Technology*, 2011. 20(2): p. 3.

Lee, J.-H., et al., "Highly Stretchable Piezoelectric-Pyroelectric Hybrid Nanogenerator", *Advanced Materials*, 2014. 26(5): p. 765-769.

Levesque, M., et al., "P(VDF-TrFE) infrared detectors and array" *SPIE*, 2269: 124-130, 1994.

Li, X., et al., "Large-Area Synthesis of High-Quality and Uniform Graphene Films on Copper Foils", *Science*, 2009. 324(5932): p. 1312-1314.

Li, Z.Q., et al., "Dirac charge dynamics in graphene by infrared spectroscopy", *Nat Phys*, 2008. 4(7): p. 532-535.

Liu, C.-H., et al., "Graphene photodetectors with ultra-broadband and high responsivity at room temperature", *Nat Nano*, 9: 273-278, (Apr. 2014).

Low, T., et al., "Graphene Plasmonics for Terahertz to Mid-Infrared Applications", *ACS Nano*, 2014. 8(2): p. 1086-1101.

Nair, R.R., et al., "Fine Structure Constant Defines Visual Transparency of Graphene", *Science*, 2008. 320(5881): p. 1308.

Ni, G.-X., et al., "Graphene-Ferroelectric Hybrid Structure for Flexible Transparent Electrodes", *ACS Nano*, 2012. 6(5): p. 3935-3942.

Notification Concerning Transmittal of International Preliminary Report on Patentability for Int'l Application No. PCT/SG2015/050201, titled: Human-Machine Interface With Graphene-Pyroelectric Materials, dated Aug. 20, 2015.

Notification Concerning Transmittal of International Preliminary Report on Patentability for Int'l Application No. PCT/SG2014/000579, titled: Pyroelectric Detector Using Graphene Electrode, dated Jun. 7, 2016.

Rogalski, A., "Infrared detectors: an overview", *Infrared Physics & Technology*, 2002. 43(3-5): p. 187-210.

Setiadi, D., et al., "A 3×1 integrated pyroelectric sensor based on VDF/TrFE copolymer", *Sensors and Actuators A: Physical*, 1996. 52(1-3): p. 103-109.

Setiadi, D., et al., "A pyroelectric polymer infrared sensor array with a charge amplifier readout", *Sensors and Actuators A: Physical*, 1999. 76(1-3): p. 145-151.

(56) References Cited

OTHER PUBLICATIONS

Takayama, R., et al., "Preparation and characteristics of pyroelectric infrared sensors made of c-axis oriented La-modified PbTiO3 thin films", *Journal of Applied Physics*, 1987. 61(1): p. 411-415.
Tassin, P., et al., "Graphene for Terahertz Applications", *Science*, 341(6146): p. 620-621 (2013).
Tonouchi, M., "Cutting-edge terahertz technology", *Nat Photon*, 2007. 1(2): p. 97-105.
Vicarelli, L., et al., "Graphene field-effect transistors as room-temperature terahertz detectors" *Nat Mater*, 2012. 11(10): p. 865-871.
Wei, C.S., et al., "Partial-electroded ZnO pyroelectric sensors for responsivity improvement", *Sensors and Actuators A: Physical*, 2006, 128(1): 18-24.
Whatmore, R.W., "Pyroelectric ceramics and devices for thermal infra-red detection and imaging", *Ferroelectrics*, 1991. 118(1): p. 241-259.
Wojtczuk, P., et al., "Recognition of Simple Gestures Using a PIR Sensor Array", *Sensors and Transducers*, 2012, vol. 14-1: pp. 83-94.
Wu, Z., et al., "Transparent, Conductive Carbon Nanotube Films", *Science*, 2004. 305(5688): p. 1273-1276.
Yan, J., et al., "Dual-gated bilayer graphene hot-electron bolometer. Nat Nano", 2012. 7(7): p. 472-478.
Yang, J., et al., "Real-time, continuous-wave terahertz imaging by a pyroelectric camera", *Chinese Optics Letters*, 2008, 6(1): 29-31.
Notice of Allowance for U.S. Appl. No. 15/101,196, entitled "Pyroelectric Detector Using Graphene Electrode", dated Aug. 28, 2017.
Non-Final Office Action for U.S. Appl. No. 15/101,196, entitled "Pyroelectric Detector Using Graphene Electrode", dated Mar. 14, 2017.
Extended European Search Report for Application No. EP 15819299.7, entitled: Human-Machine interface with Graphene-Fyroelectric Materials, 12 pages, dated Feb. 2, 2018.

\* cited by examiner

HUMAN-MACHINE INTERFACE WITH GRAPHENE-PYROELECTRIC MATERIALS

RELATED APPLICATION

This application is the U.S. National Stage of International Application No. PCT/SG2015/050201, filed Jul. 7, 2015, which designates the U.S., published in English, and claims the benefit of U.S. Provisional Application No. 62/021,770, filed Jul. 8, 2014. The entire teachings of the above applications are incorporated herein by reference.

BACKGROUND OF THE INVENTION

Existing technologies for interfacing between a human and a communicable machine, such as a smartphone or tablet, utilize a variety of different technologies, including the capacitive touchscreen. However, there is an ongoing need for human-machine interfaces that, among other features, allow non-contact operation, offer low power consumption, and are compatible with large-area devices.

SUMMARY OF THE INVENTION

A version of the invention comprises a device for controlling or interfacing with a computer or other form of communicable machine based on the pyroelectric effect, and includes at least one optically- and infrared- (IR-) transparent graphene electrode.

In one version of the invention, there is provided a control device for interfacing between a human and a communicable machine based on the pyroelectric effect. The control device comprises (i) at least one graphene electrode configured to transmit at least a portion of infrared radiation, emitted from the at least a portion of the human's body in a motion relative to the control device, to at least one pyroelectric active layer; (ii) the at least one pyroelectric active layer, said at least one pyroelectric active layer being configured to undergo a reorientation of dipoles in response to the portion of the infrared radiation received through the at least one graphene electrode; and (iii) at least one rear electrode. The at least one graphene electrode, the at least one pyroelectric active layer and the at least one rear electrode define at least one pixel configured to generate an electrical signal, in response to the motion of the at least a portion of the human's body relative to the control device, based on at least the reorientation of the dipoles in the at least one pyroelectric active layer.

In further, related versions, the at least one pyroelectric active layer may be optically transparent, and may comprise polyvinylidene fluoride or a co-polymer of polyvinylidene fluoride, such as polyvinylidene fluoride-co-trifluoroethylene. Alternatively, the at least one pyroelectric active layer may be optically opaque, for example comprising lead zirconate titanate. The at least one rear electrode may comprise an optically transparent conductor. For example, the at least one rear electrode may comprise an optically transparent, infrared transparent conductor (i.e., graphene), or may comprise an optically transparent, infrared absorbing or reflecting conductor, such as at least one of: indium tin oxide and a silver nanowire. The at least one rear electrode may comprise an optically non-transparent conductor, such as at least one of: gold; nickel; and copper. The at least one graphene electrode may comprise a first array of a plurality of electrodes configured to be selectively activated in response to one of an x-position or a y-position of the at least a portion of the human body relative to the first array; and the at least one rear electrode may comprise a second array of a plurality of electrodes configured to be selectively activated in response to another one of the x-position or the y-position of the at least a portion of the human body relative to the second array. The at least one pixel may comprise an array of at least one of: a plurality of diamond-shaped pixels; a plurality of rectangle-shaped pixels; and a plurality of triangle-shaped pixels. The control device may be integrated with a display. For example, the control device may be mounted such that the display is underlying the control device. Alternatively, the at least one rear electrode may be mounted underlying the display, and the at least one graphene electrode and the at least one rear electrode may be further configured to drive the display. The control device may further comprise at least one dark pixel configured to reduce or eliminate noise in the control device. The control device may be connected to control the communicable machine and may be located separate from the communicable machine. The control device may receive no external power to detect the motion of the at least a portion of the human's body relative to the control device; and may detect the motion of the at least a portion of the human's body relative to the control device without contacting the at least a portion of the human's body. The control device may be mechanically flexible. The control device may be connected for human interface with at least one of: a computer, a smartphone, an interactive television, a tablet, a trackpad, a virtual gaming device and a motion-based door activator.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

A version of the invention relates to the construction of a device capable of interfacing between a human and a computer, smartphone or other communicable machine using the pyroelectric effect. Unlike existing technologies, such as: standard capacitive touchscreens, which require a capacitive link between a human and the electrode; resistive touchscreens; or piezoelectric touchscreens, which require pressure from a human hand; a pyroelectric controller in accordance with a version of the invention detects human infrared radiation to interface with the machine. Graphene, being the only material that is uniformly transparent to both visible and infrared radiation (1), allows a device in accordance with a version of the invention to be used in display-based technologies such as smartphones. For example, a version of the invention may be used in a display-based technology such as a smartphone by using optically transparent/IR-opaque pyroelectric materials such as polyvinylidene fluoride, or any of its copolymers (2).

A device in accordance with a version of the invention, which is also referred to herein as a controller or control device, is used to detect human motion by means of the pyroelectric effect for the purpose of controlling a computer, smartphone or other communicable machine. The pyroelectric effect describes the ability of pyroelectric materials to generate a temporary voltage when exposed to time-dependent changes in temperature. In the case of a controller in accordance with a version of the invention, the time-dependent change in temperature is realized through the absorption of radiation emitted by a moving warm body such as a human being.

Figure 1:
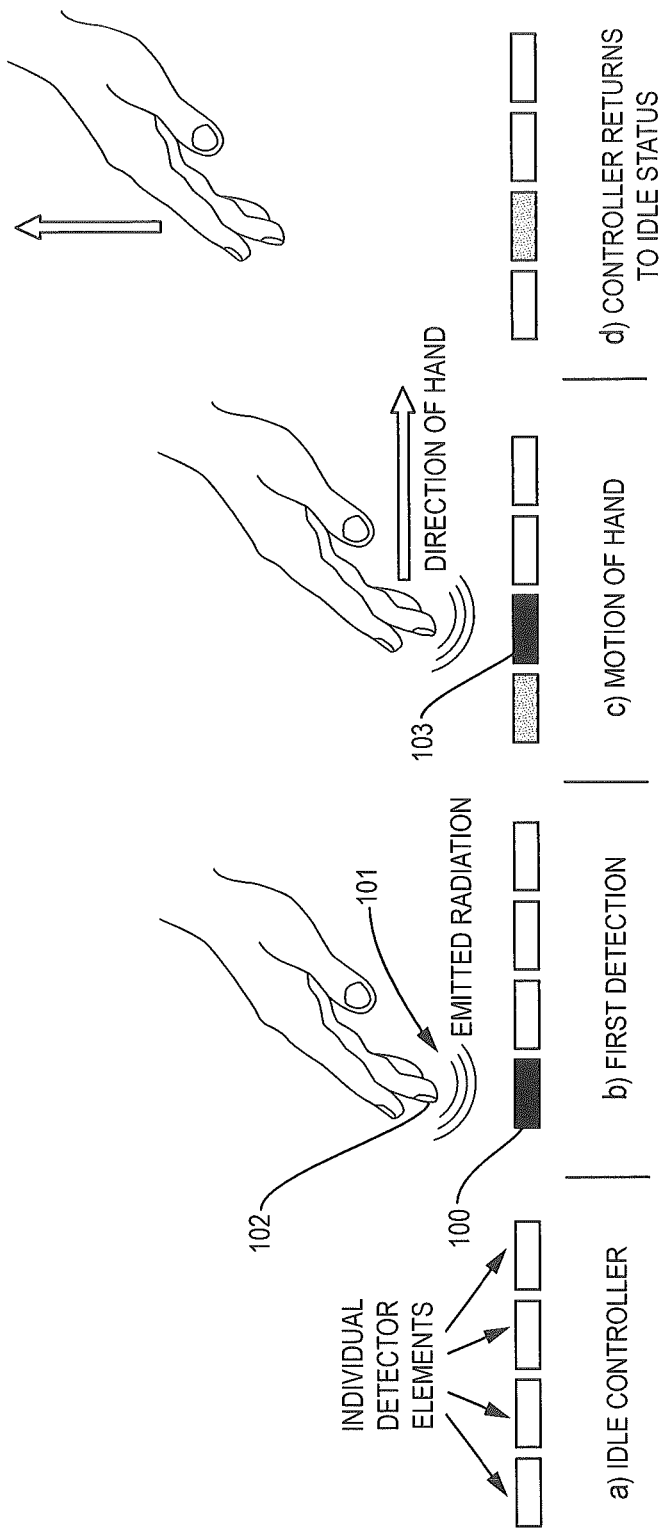
FIG. 1 is a schematic diagram illustrating a basis of operation of a pyroelectric controller, indicating each detector's ability to detect user interactions, in accordance with a version of the invention.

FIG. 1 is a schematic diagram illustrating a basis of operation of a pyroelectric controller, indicating each detector's ability to detect user interactions, in accordance with a version of the invention. From the left in FIG. 1, in action (a), an idle controller is shown, comprising individual detector elements (such as pixels), with no user activity in the vicinity. In action (b), a first detection of a user's finger is detected at the left-most detector element 100, based on emitted infrared (IR) radiation 101 from a portion of the human user's body (here, a finger 102). The resulting signal detected by the detector element 100 is passed to controller logic and the user's action is processed by the communicable device to which the detector is linked. In action (c), the user moves their hand towards the right. The left-most detector element 100 loses signal, and the second from the left detector element 103 picks up the signal. The new signal is passed to controller logic and the action is processed. In action (d), the user's hand leaves the vicinity and the controller loses the signal, returning to an idle state.

In accordance with a version of the invention, the controller can be fashioned out of either one or multiple pixels each consisting of a pyroelectric material encapsulated between two electrodes. The pyroelectric material may be an optically transparent pyroelectric material such as polyvinylidene fluoride (PVDF) and its copolymers such as polyvinylidene fluoride-co-trifluoroethylene (PVDF-TrFE), or may be opaque such as lead zirconate titanate (PZT). The electrode facing the human is, in either case, made with graphene due to its low IR absorption. Depending on the application, the rear electrode may be made of an optically transparent conductor, including but not limited to graphene, which is also infrared transparent; or an optically transparent but infrared absorbing or reflecting material such as indium tin oxide (ITO) and silver nanowires (for display-integrated controllers); or an optically non-transparent conductor including, but not limited to, gold, nickel and copper, for applications not requiring optical transparency. The two electrodes may be arranged in a similar layout to that of one- or two-layer capacitive touchscreen electrodes, including but not limited to pixelated diamonds, rectangles (such as squares), triangles or other similar structures.

Figure 2A:
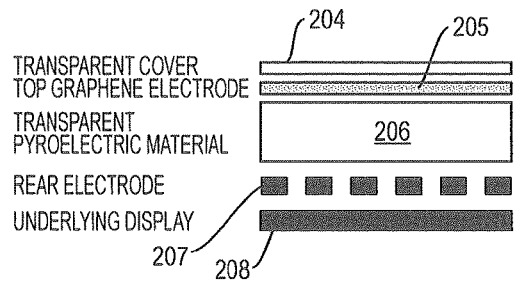
FIGS. 2A and 2B are two-dimensional and three-dimensional schematic diagrams, respectively, of a configuration of an out-of-cell display-integrated graphene-pyroelectric controller, in accordance with a version of the invention.
Figure 2C:
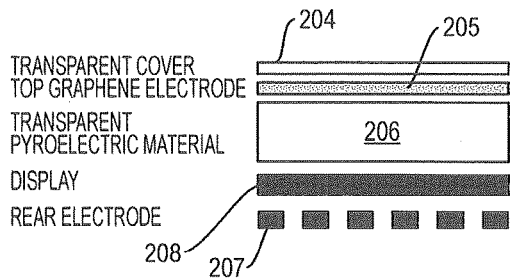
FIGS. 2C and 2D are two-dimensional and three-dimensional schematic diagrams, respectively, of a configuration of an in-cell display integrated graphene-pyroelectric controller, in accordance with a version of the invention.
Figure 2B:
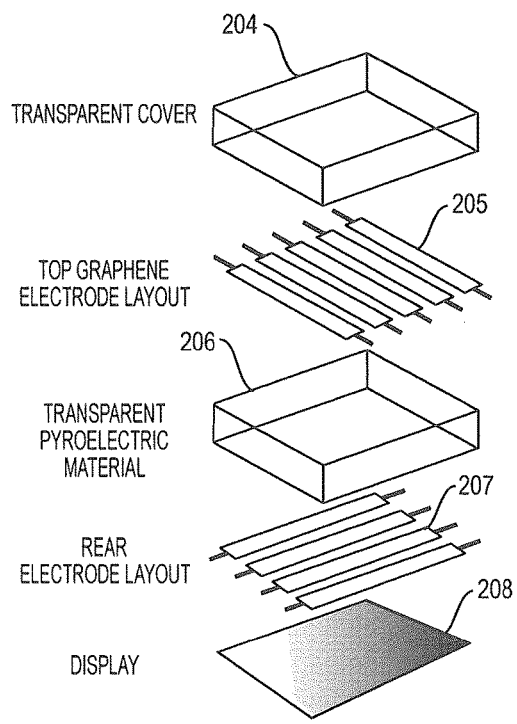
Figure 2D:
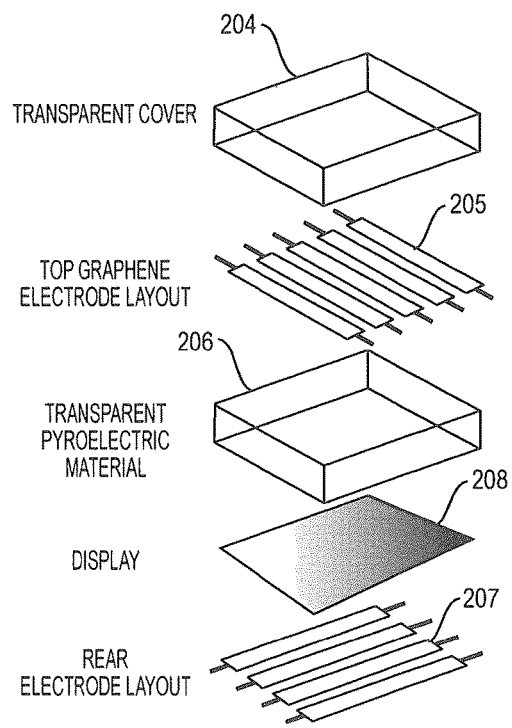

FIGS. 2A-2D are schematic diagrams of structures for a pixelated graphene-pyroelectric controller fabricated for display-integrated applications, in accordance with a version of the invention. Display-integrated controllers in accordance with a version of the invention may be further subcategorized into out-of-cell controllers (as shown in FIGS. 2A and 2B, below) or in-cell controllers (as shown in FIGS. 2C and 2D, below). In an in-cell display controller, the controller electrodes are used to both detect human radiation and drive the display. In both configurations, a "blind" or "dark" pixel may be utilized to filter or eliminate potential sources of noise such as piezoelectric contributions from acoustic noise, thermal contributions from the battery causing false touch etc.

FIGS. 2A and 2B are two-dimensional and three-dimensional schematic diagrams, respectively, of a configuration of an out-of-cell display-integrated graphene-pyroelectric controller, in accordance with a version of the invention. The out-of-cell display-integrated controller includes a transparent cover 204, at least one top graphene electrode 205, a transparent pyroelectric material 206, at least one rear electrode 207, and an underlying display 208. It can be seen that the at least one top graphene electrodes 205 can include multiple elements, which can, for example, be oriented as strips extending in one direction (call it the x-direction), while the at least one rear electrode 207 can be oriented as strips extending in another direction (the y-direction) extending perpendicular to the elements of the top graphene electrodes 205, in order to permit localizing of incoming IR radiation. It will be appreciated that other array arrangements can be used for the electrodes 205 and 207 in order to permit localizing of radiation impinging on the device. In one version according to the invention, the device can include a top graphene electrode 205 functioning as an array of x-sensors, a pyroelectric layer 206 comprising, for example, polyvinylidene fluoride-co-trifluoroethylene (PVDF-TrFE), and a rear electrode 207, for example comprising graphene, which can function as an array of y-sensors.

FIGS. 2C and 2D are two-dimensional and three-dimensional schematic diagrams, respectively, of a configuration of an in-cell display integrated graphene-pyroelectric controller, in accordance with a version of the invention. As with the out-of-cell display-integrated controller of FIGS. 2A and 2B, the in-cell display integrated controller of FIGS. 2C and 2D includes a transparent cover 204, at least one top graphene electrode 205, a transparent pyroelectric material 206, a display 208 and at least one rear electrode 207; with a difference being that the display 208 is positioned above the at least one rear electrode 207.

Figure 3A:
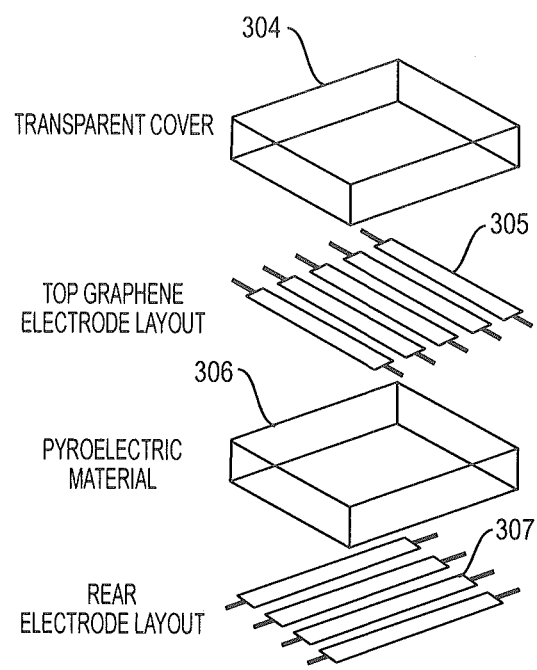
FIGS. 3A and 3B are three-dimensional and two-dimensional schematic diagrams, respectively, of a configuration of an off-display graphene-pyroelectric controller, in accordance with a version of the invention.
Figure 3B:
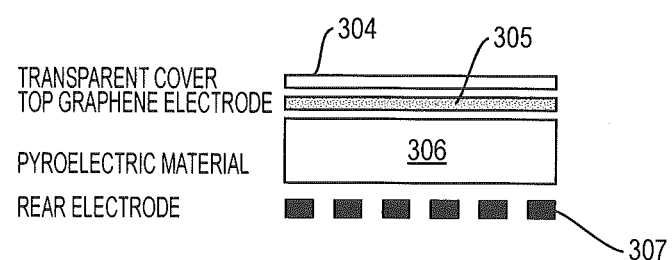

FIGS. 3A and 3B are three-dimensional and two-dimensional schematic diagrams, respectively, of a configuration of an off-display graphene-pyroelectric controller, in accordance with a version of the invention. Such controllers can be standalone entities and can be used to control other communicable machines without being linked to an underlying display. In this instance, where transparency is not required, the pyroelectric material need not be transparent and the rear electrode need not be fabricated of a transparent conductor. The top electrode must still be fabricated with graphene in order to enable incident radiation from the user to pass to the pyroelectric layer. The off-display controller includes a transparent cover 304, at least one top graphene electrode 305, a transparent pyroelectric material 306, and at least one rear electrode 307.

In accordance with a version of the invention, the lateral resolution/accuracy of the controller device could potentially be reduced by stray signals from the human user interfering with the sensor—for example, stray signals could come from the user's palm, wrist, face or another part of the body other than fingertip or other portion of the human body from which signals are intended to be received. This potential drawback may be overcome by introducing a signal threshold, whereby signals below a certain intensity are rejected by the controller.

Advantages

In addition to other advantages described herein, a version according to the invention can have numerous other benefits both over conventional capacitive machine interface technologies and over other pyroelectric motion detectors, which can include one or more of the following benefits. Benefits will be divided into two sections for greater clarity (advantages over capacitive touchscreens, and advantages over conventional pyroelectric motion detection systems).

1. Advantages Over Capacitive Touchscreens:

a) Lower Power Consumption: Unlike capacitive touchscreens, where power is continuously needed to drive the controller and detect the touch, a pyroelectric controller in accordance with a version of the invention needs no power to detect human activity. This is because a pyroelectric controller in accordance with a version of the invention can use the radiation emitted from the user to generate its own signal, as per the pyroelectric effect. This results in significantly lower power draw and thus greater energy efficiency.

b) No "accidental touch" problem: Since the pyroelectric effect requires a change in temperature to generate a signal, leaving a controller in accordance with a version of the invention constantly near a warm body does not generate a continuous signal. Instead, the detector element only senses the first spike in temperature change, and then saturates to a new temperature. When used in smartphones, the use of a pyroelectric controller in accordance with a version of the invention can eliminate the "pocket dial" problem.

c) Non-contact operation: In accordance with a version of the invention, the pyroelectric effect is capable of detecting radiation from human activity at a distance specified by the manufacturer of the controller. Thus, no physical contact between the user and the controller is needed, enhancing the lifespan of the device.

d) Large-area compatible: Existing research into touchscreens based on transparent flexible conductors such as graphene is trying to overcome the inhomogeneity in the material's sheet resistance as the size is increased. For this reason, such transparent flexible conductors are currently incapable of being used in large-scale touchscreen applications. In accordance with a version of the present invention, the homogeneity of the sheet resistance of the graphene is not a critical factor in signal detection. As such, a controller in accordance with a version of the invention is capable of being operated for devices of any size ranging from several millimeters to large-area devices such as tablet devices, televisions and others.

2. Advantages Over Conventional Pyroelectric Motion Detection Systems

The general advantages of using a graphene-based pyroelectric system over a conventional pyroelectric system have been discussed in published PCT Application WO 2015/084267 A1 of the National University of Singapore, the entire teachings of which application are incorporated by reference in their entirety. Such advantages include the following, which are also applicable to a version in accordance with the present invention:

a) Higher efficiency: The use of graphene as an IR-transparent top conductor enables higher device efficiency as a higher proportion of incident radiation may be absorbed by the pyroelectric material.

b) Flexibility: Existing pyroelectric sensors are not able to operate flexibly due to the rigidity of either of the conducting electrodes.

Applications

Among other potential applications, a version according to the invention can be used to replace any form of existing touchscreen for communicable machines, such as smartphones, tablets or other human-machine interfaces such as trackpads, virtual gaming devices (such as the X-Box Kinect™, sold by Microsoft Corporation of Redmond, Wash., U.S.A.), motion-based door activators and others. A version according to the invention can, for example, be industrially relevant for large area devices, due to the fact that a version according to the invention overcomes the size limitations experienced by capacitive touchpanels. This paves the way for the development of communicable large area devices such as interactive televisions.

Definitions

"Pyroelectric active layer," as used herein, refers to an active layer of a device in accordance with a version of the invention that makes use of the "pyroelectric" effect, which term, as used herein, relates to the spontaneous polarization/depolarization observed within the dipoles of certain materials as a result of a time-varying temperature change. The term "time-varying" as it is used herein refers to changes in the bulk temperature of a material over a period of time.

As used herein, the term "graphene" is used to refer to: single layer graphene (SLG), bilayer graphene (BLG), multilayer graphene (MLG), reduced graphene oxide (RGO) and graphene platelets.

As used herein, the term "communicable machine" includes any machine capable of receiving and processing signals generated as a result of a gesture from a human user, such as, but not limited to, a swipe, slide or touch of a finger, hand or other portion of the human body. For example, the communicable machine may be, but is not limited to, a computer, a smartphone, an interactive television, a tablet, a trackpad, a virtual gaming device and a motion-based door activator.

REFERENCES (1) Nair, R. R., et al., *Fine Structure Constant Defines Visual Transparency of Graphene*. Science, 2008. 320(5881): p. 1308.

(2) Levesque, M., et al. *P(VDF-TrFE) infrared detectors and array*. 1994.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A control device for interfacing between a human and a communicable machine based on the pyroelectric effect, the control device comprising:
   at least one graphene electrode configured to transmit at least a portion of infrared radiation, emitted from the at least a portion of the human's body in a motion relative to the control device, to at least one pyroelectric active layer;
   the at least one pyroelectric active layer, said at least one pyroelectric active layer being configured to undergo a reorientation of dipoles in response to the portion of the infrared radiation received through the at least one graphene electrode; and
   at least one rear electrode;
   the at least one graphene electrode, the at least one pyroelectric active layer and the at least one rear electrode defining at least one pixel configured to generate an electrical signal, in response to the motion of the at least a portion of the human's body relative to the control device, based on at least the reorientation of the dipoles in the at least one pyroelectric active layer.

2. The control device of claim 1, wherein the at least one pyroelectric active layer is optically transparent or wherein the at least one pyroelectric active layer is optically opaque.

3. The control device of claim 2, wherein the at least one pyroelectric active layer comprises polyvinylidene fluoride or a co-polymer of polyvinylidene fluoride.

4. The control device of claim 3, wherein the at least one pyroelectric active layer comprises polyvinylidene fluoride-co-trifluoroethylene.

5. The control device of claim 2, wherein the at least one pyroelectric active layer comprises lead zirconate titanate.

6. The control device of claim 1, wherein the at least one rear electrode comprises an optically transparent conductor.

7. The control device of claim 6, wherein the at least one rear electrode comprises graphene or at least one of: indium tin oxide and a silver nanowire.

8. The control device of claim 1, wherein the at least one rear electrode comprises an optically non-transparent conductor.

9. The control device of claim 8, wherein the at least one rear electrode comprises at least one of: gold; nickel; and copper.

10. The control device of claim 1, wherein the at least one graphene electrode comprises a first array of a plurality of electrodes configured to be selectively activated in response to one of an x-position or a y-position of the at least a portion of the human body relative to the first array, and wherein the at least one rear electrode comprises a second array of a plurality of electrodes configured to be selectively activated in response to another one of the x-position or the y-position of the at least a portion of the human body relative to the second array.

11. The control device of claim 1, wherein the at least one pixel comprises an array of at least one of: a plurality of diamond-shaped pixels; a plurality of rectangle-shaped pixels; and a plurality of triangle-shaped pixels.

12. The control device of claim 1, wherein the control device is integrated with a display.

13. The control device of claim 12, wherein the control device is mounted such that the display is underlying the control device.

14. The control device of claim 12, wherein the at least one rear electrode is mounted underlying the display, and wherein the at least one graphene electrode and the at least one rear electrode are further configured to drive the display.

15. The control device of claim 12, further comprising at least one dark pixel configured to reduce or eliminate noise in the control device.

16. The control device of claim 1, wherein the control device is connected to control the communicable machine and is located separate from the communicable machine.

17. The control device of claim 1, wherein the control device receives no external power to detect the motion of the at least a portion of the human's body relative to the control device.

18. The control device of claim 1, wherein the control device detects the motion of the at least a portion of the human's body relative to the control device without contacting the at least a portion of the human's body.

19. The control device of claim 1, wherein the control device is mechanically flexible.

20. The control device of claim 1, wherein the control device is connected for human interface with at least one of: a computer, a smartphone, an interactive television, a tablet, a trackpad, a virtual gaming device and a motion-based door activator.

* * * * *